United States Patent
Visser et al.

(10) Patent No.: US 8,339,203 B2
(45) Date of Patent: *Dec. 25, 2012

(54) PA LOAD-LINE TUNING WITH CAPACITORS AROUND A BALUN

(75) Inventors: Hendrik Visser, Wijchen (NL); Roeland Heijna, Nijmegen (NL); Norbert Van Den Bos, Wijchen (NL)

(73) Assignee: ST-Ericsson SA, Plan-Les-Ouates (CH)

( * ) Notice: Subject to any disclaimer, the term of this patent is extended or adjusted under 35 U.S.C. 154(b) by 0 days.

This patent is subject to a terminal disclaimer.

(21) Appl. No.: 12/982,276

(22) Filed: Dec. 30, 2010

(65) Prior Publication Data
US 2012/0075019 A1    Mar. 29, 2012

Related U.S. Application Data

(60) Provisional application No. 61/386,055, filed on Sep. 24, 2010.

(51) Int. Cl.
*H03F 3/45* (2006.01)
(52) U.S. Cl. .................................................. 330/301
(58) Field of Classification Search .............. 330/301; 333/25, 26
See application file for complete search history.

(56) References Cited

U.S. PATENT DOCUMENTS

| | | | |
|---|---|---|---|
| 5,986,617 A | 11/1999 | McLellan | |
| 7,129,803 B2 | 10/2006 | Khorram et al. | |
| 7,911,277 B2 | 3/2011 | Paul et al. | |
| 2005/0208917 A1 | 9/2005 | Roufoogaran et al. | |
| 2007/0035356 A1 | 2/2007 | Ranta | |
| 2008/0278258 A1 | 11/2008 | Liu | |
| 2009/0096533 A1 | 4/2009 | Paul | |
| 2011/0128088 A1* | 6/2011 | Jin et al. ............... | 333/25 |

FOREIGN PATENT DOCUMENTS

WO   2004098076 A1   11/2004

OTHER PUBLICATIONS

F. Carrara et al., "A 2.4 GHz, 24 dBm SOI CMOS Power Amplifier with Fully Integrated Output Balun and Switched Capacitors for Load Line Adaptation," Presentation from IEEE Power Amplifier Symposium, Fall 2009, 23 pgs.

* cited by examiner

*Primary Examiner* — Steven J Mottola
(74) *Attorney, Agent, or Firm* — Coats & Bennett, P.L.L.C.

(57) ABSTRACT

An on-chip power amplifier includes first and second variable capacitors connected in parallel with first and second windings, respectively, of an on-chip balun. The first balun winding connects between the differential outputs of an on-chip differential amplifier. Varying the first variable capacitor changes the imaginary part of the load impedance of the differential amplifier, while varying the second variable capacitor changes the real part of the load impedance of the differential amplifier. In one embodiment, the first and second variable capacitors are generally orthogonal, such that the first and second variable capacitors are less than 25% correlated. As a result, varying the first variable capacitor has little impact on the real part of the load impedance, and varying the second variable capacitor has little impact on the imaginary part of the load impedance. In this way the load impedance can be tuned to the optimum performance.

17 Claims, 12 Drawing Sheets

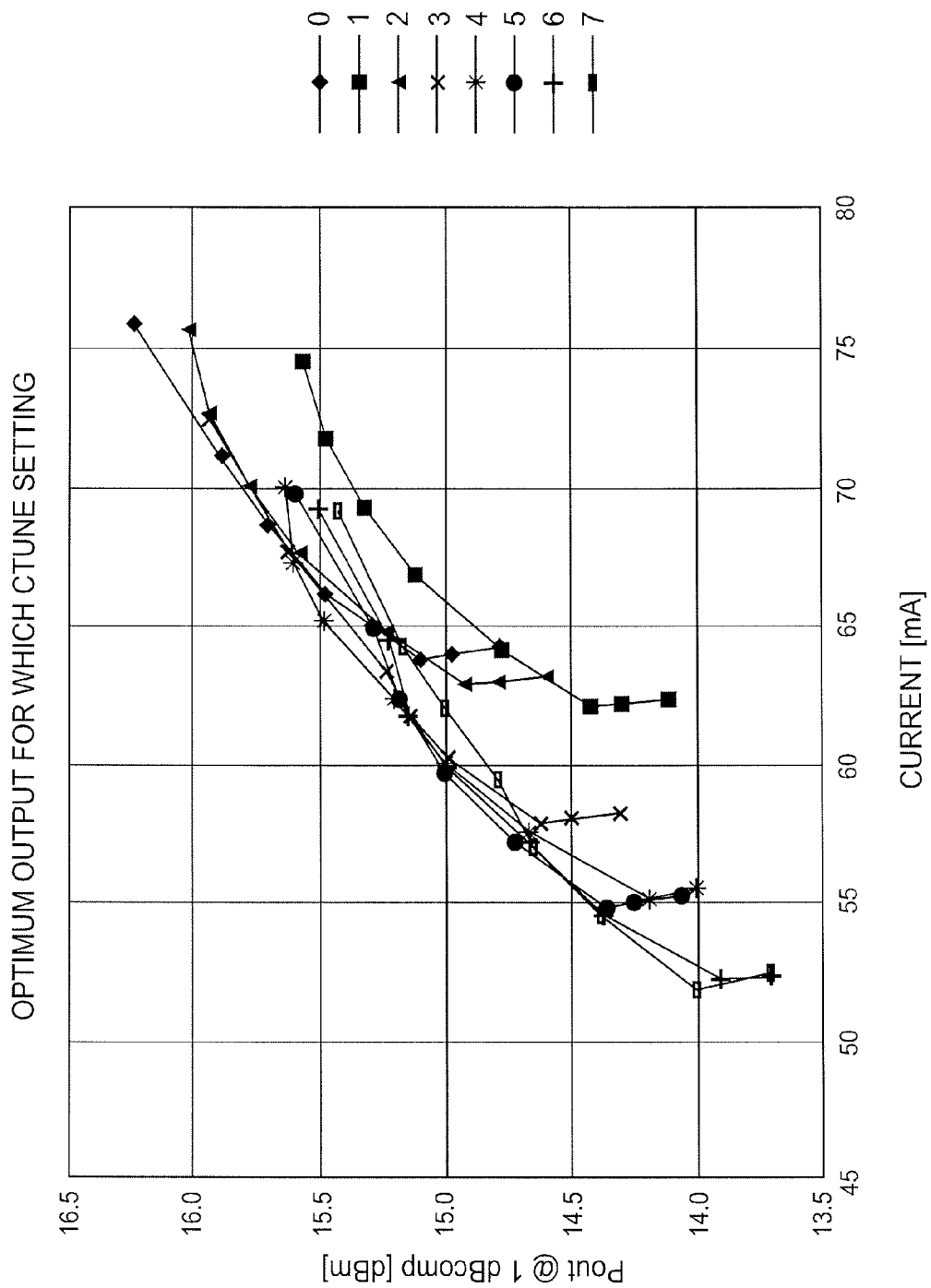

PA LOAD-LINE TUNING WITH CAPACITORS AROUND A BALUN

This application claims priority to Provisional U.S. Patent Application 61/386,055 filed 24 Sep. 2010, which is incorporated herein by reference.

The invention described herein relates generally to controlling a load impedance of a power amplifier, and more particularly to separately controlling real and imaginary parts of the load impedance of the power amplifier.

BACKGROUND

The efficiency of a power amplifier, such as used to amplify wireless signals for transmission, largely depends on the load impedance of the amplifier. For example, a small load impedance may result in a large output power at the expense of a large output current, which translates into a low efficiency. Contrastingly, a large load impedance may result in less output power and current consumption, and thus have a higher efficiency. Because the amplifier load impedance directly affects the amplifier efficiency, it is desirable to be able to control the amplifier load impedance based on a desired performance. Further, such load impedance control desirably facilitates the ability to more closely match the load impedance of the amplifier to that of an element connected to the amplifier, e.g., an antenna.

One option varies the load impedance using biased pin diodes and capacitors. While a pin diode is an ideal RF switch, pin diodes cannot be integrated with a CMOS chip. Thus, the pin diode option is not desirable for on-chip power amplifiers.

Another option implements load impedance switching using variable LC networks that may be integrated on the chip with the power amplifier. Such LC networks, however, require bulky inductor coils, and therefore, undesirably increase the size of the chip.

Thus, there remains a need for small, on-chip options for varying the load impedance of an on-chip power amplifier.

SUMMARY

The on-chip power amplifier described herein includes first and second variable capacitors. Varying the first and second variable capacitors respectively varies the imaginary and real parts of an amplifier load impedance. An exemplary on-chip power amplifier includes a differential power amplifier having differential outputs, a balun, and the first and second variable capacitors. The balun includes a first winding operatively connected between the differential outputs. The first variable capacitor is operatively connected to the differential outputs in parallel with the first winding of the balun. The second variable capacitor is operatively connected in parallel with a second winding of the balun. Varying the first variable capacitor changes the imaginary part of the load impedance of the differential amplifier, while varying the second variable capacitor changes the real part of the load impedance of the differential amplifier. In one exemplary embodiment, the first and second variable capacitors are generally orthogonal such that the first and second variable capacitors are less than 25% correlated. As a result, varying the first variable capacitor has little impact on the real part of the load impedance, and varying the second variable capacitor has little impact on the imaginary part of the load impedance.

An exemplary method of controlling a load impedance of an on-chip power amplifier is further disclosed herein, where the on-chip power amplifier includes a balun having a first winding operatively connected between differential outputs of a differential power amplifier. The method includes varying a first variable capacitor operatively connected to the differential outputs in parallel with the first winding of the balun to vary the imaginary part of the load impedance. The method further includes varying a second variable capacitor operatively connected in parallel with a second winding of the balun to vary the real part of the load impedance.

BRIEF DESCRIPTION OF THE DRAWINGS

FIGS. 6A-6D depict more simulated performance results for the on-chip power amplifier.

DETAILED DESCRIPTION

Figure 1:
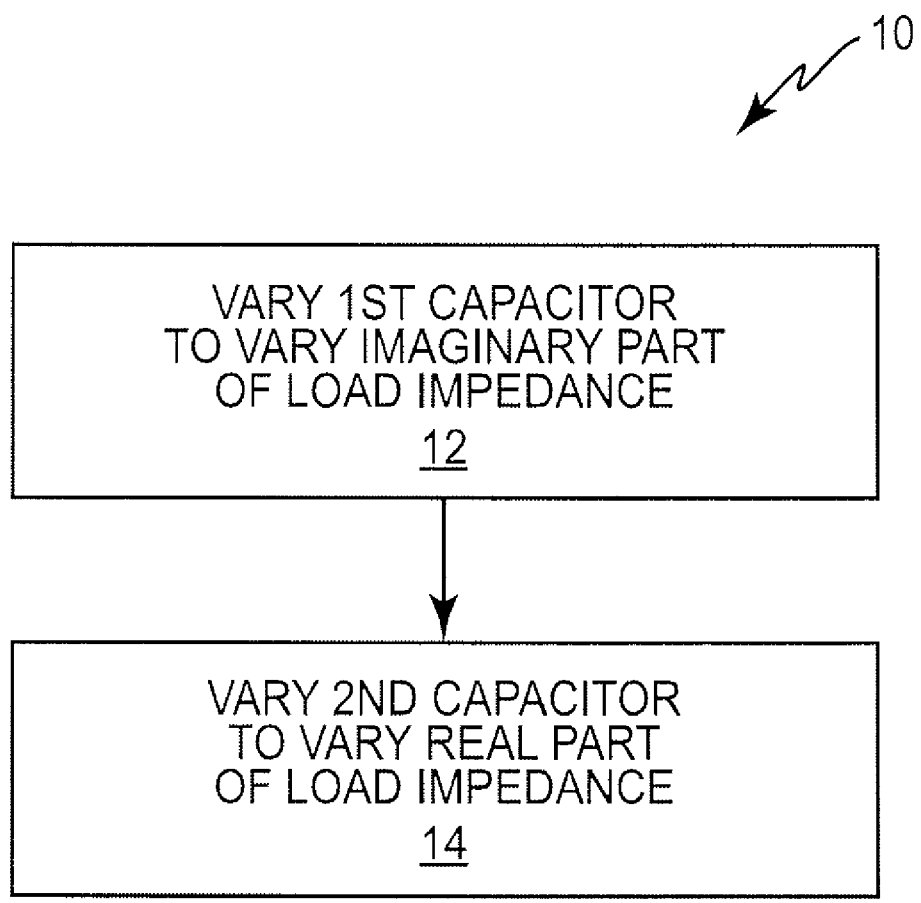
FIG. 1 depicts one exemplary load impedance control method.

Embodiments described herein control the load impedance of an on-chip power amplifier using on-chip components, e.g., on-chip capacitors connected in parallel with the winding elements of an on-chip balun connected between differential outputs of a differential amplifier. FIG. 1 depicts one exemplary method 10 of controlling the load impedance of such an on-chip power amplifier. The method includes varying the impedance of a variable impedance element connected between the differential outputs of the differential amplifier and in parallel with a first winding of the balun to vary the imaginary part of the amplifier load impedance (block 12). The method further includes varying an impedance of a variable impedance element connected in parallel with a second winding of the balun to vary the real part of the amplifier load impedance (block 14). In some embodiments, the variable impedance elements are less than 25% correlated, and therefore are generally orthogonal. Thus, varying the impedance of the variable impedance element in parallel with the first winding varies the imaginary part of the load impedance with little to no impact on the real part of the load impedance. Varying the impedance of the variable impedance element in parallel with the second winding varies the real part of the load impedance with little to no impact on the imaginary part of the load impedance.

Figure 2:
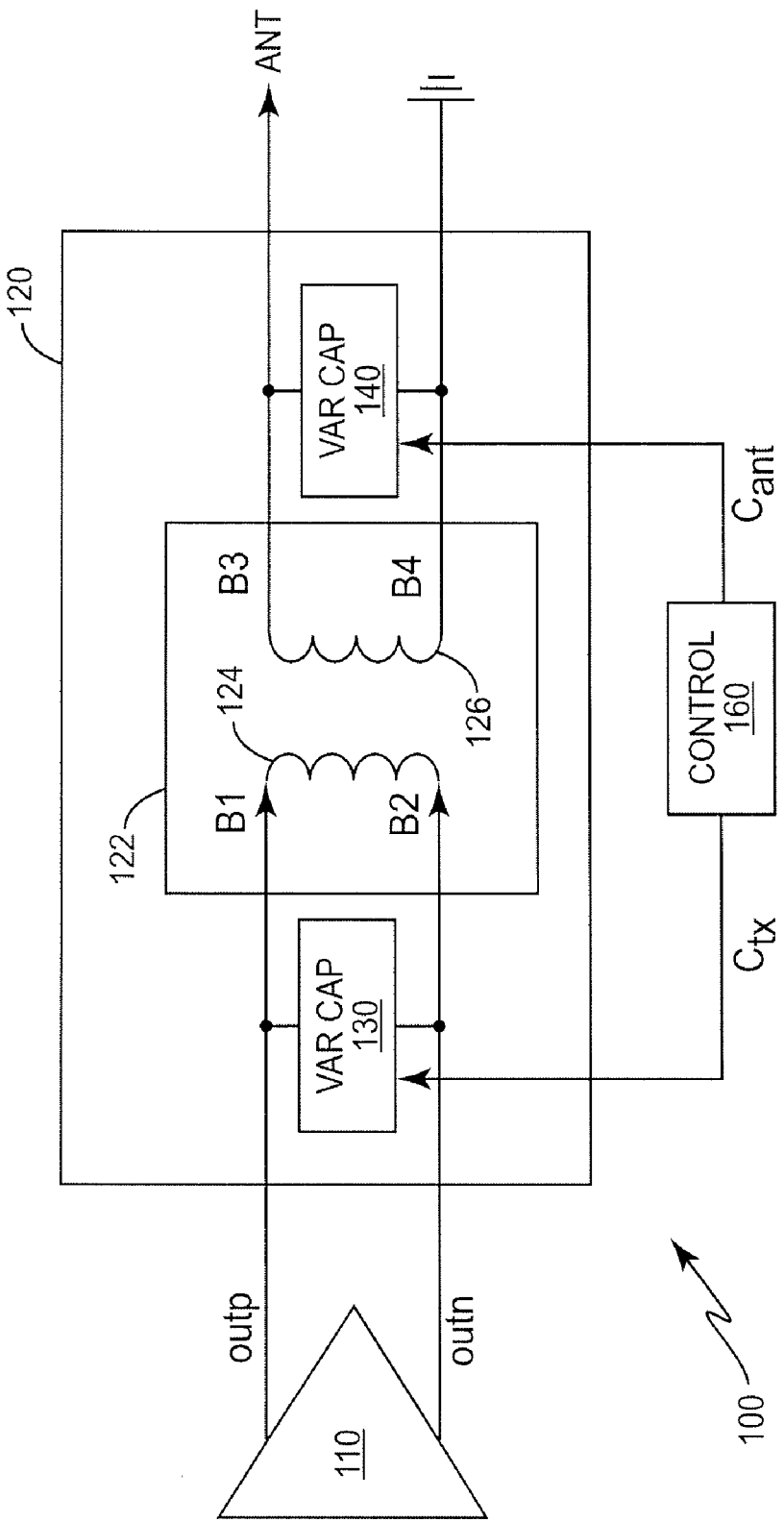
FIG. 2 depicts one exemplary on-chip power amplifier as disclosed herein.

FIG. 2 depicts an exemplary on-chip power amplifier 100 comprising a differential amplifier 110 and an adaptive impedance unit 120, both of which are implemented on an integrated chip. The adaptive impedance unit 120 comprises a balun 122 having a first inductive winding 124 and a second inductive winding 126. The first inductive winding 124 includes two connection points B1, B2 on either end of the first winding 124 that respectively connect to the differential outputs $out_p$, $out_n$ to connect the first inductive winding 124 between the differential amplifier outputs. The second inductive winding 126 includes two connection points B3, B4 on either end of the second winding 126 that connect to an external load, e.g., an antenna ANT and ground, respectively. The first and second inductive windings 124, 126 electromagnetically couple based on the number of turns in and relative orientation of the first and second windings 124, 126. A first variable capacitor 130, also referred to herein as transmitter capacitor 130, is connected in parallel with the first winding 124, and a second variable capacitor 140, also referred to herein as antenna capacitor 140, is connected in parallel with the second winding 126. Controller 160 generates control signals $C_{tx}$, $C_{ant}$ that control the capacitance of the transmitter and antenna capacitors 130, 140, respectively, based on a desired amplifier load impedance, amplifier efficiency, amplifier output power, and the like. In one embodiment, control signals $C_{tx}$ and $C_{ant}$ comprise digital control signals. Analog control signals, however, may be used in other embodiments.

In one exemplary embodiment, the transmitter and antenna capacitors 130, 140 are generally orthogonal so that the transmitter and antenna capacitors 130, 140 are correlated by less than 25%. As a result, varying the capacitance of the transmitter capacitor 130 minimally affects the real part of the load impedance, and varying the capacitance of the antenna capacitor 140 minimally affects the imaginary part of the load impedance. Thus, controlling the capacitances of the transmitter and antenna capacitors 130, 140 substantially independently controls the imaginary and real parts of the amplifier load impedance. In other embodiments, however, the transmitter and antenna capacitors 130, 140 are not orthogonal, but are instead configured such that varying the transmitter and antenna capacitors 130, 140 results in different impacts on the real and imaginary parts of the load impedance. In other words, variations in the capacitance of the transmitter capacitor 130 impact the real part of the load impedance differently than variations in the capacitance of the antenna capacitor 140, and vice versa.

The transmitter and antenna capacitors 130, 140 may comprise any type of variable or otherwise programmable capacitors. In one embodiment, one or more of the transmitter and antenna capacitors 130, 140 each comprise multiple individual capacitors connected either in parallel or in series, where each of the capacitors are selectively enabled by switching circuitry. In one embodiment, each of the individual capacitors making up the transmitter and/or antenna capacitors 130, 140 has a fixed value, where a controller 160 controls the overall capacitance of the transmitter and/or antenna capacitors 130, 140 by selectively enabling one or more of the fixed capacitors. One or more of the individual capacitors in the transmitter and/or antenna capacitors 130, 140 may alternatively comprise tunable capacitors. In this case, controller 160 controls the overall capacitance of the transmitter and/or antenna capacitors 130, 140 by tuning one or more of the tunable capacitors to a desired capacitance, and also selectively enabling one or more of the individual capacitors.

Figure 3:
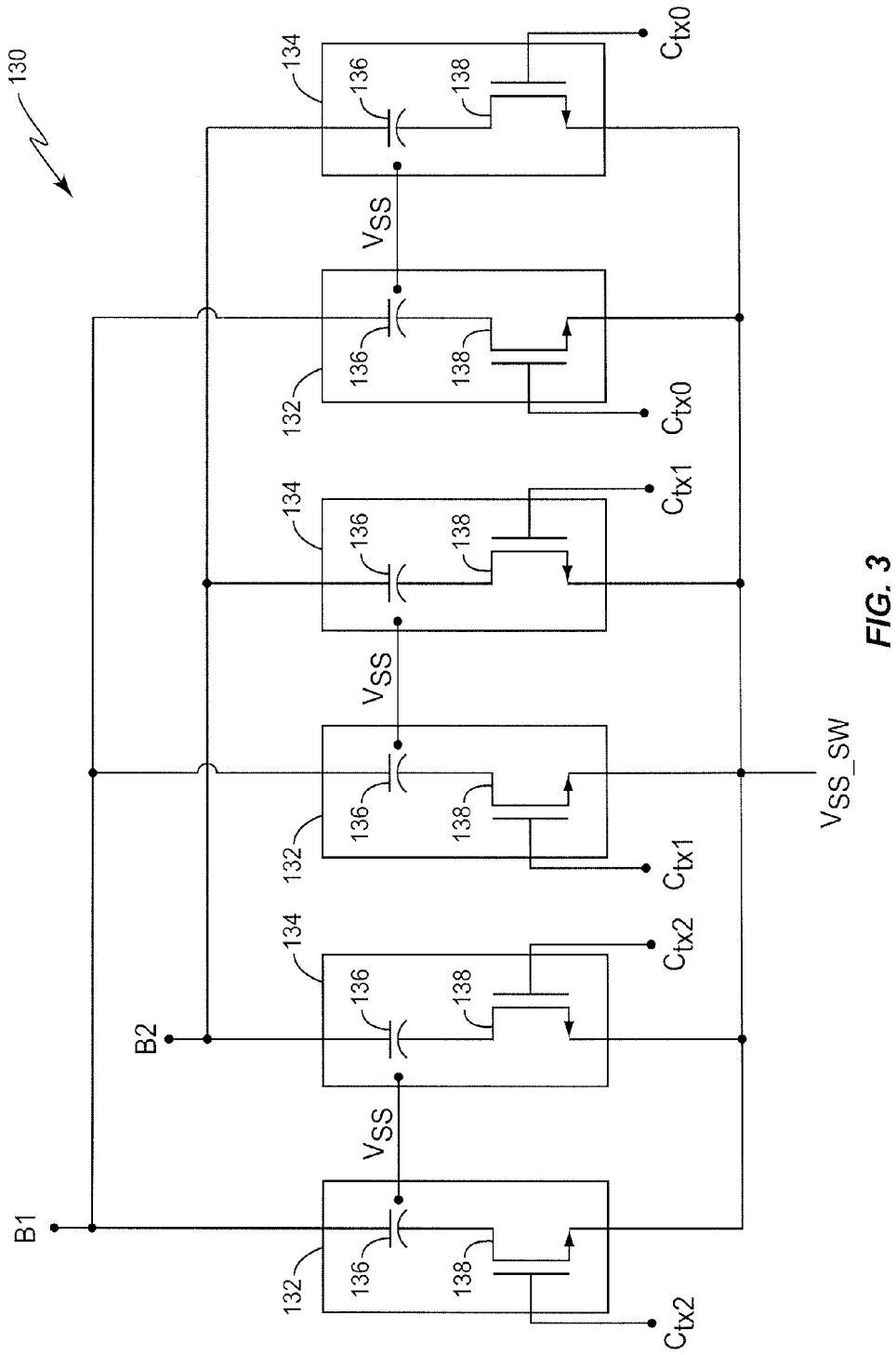
FIG. 3 depicts a circuit diagram of an exemplary variable capacitor for the adaptive impedance unit disclosed herein.

FIG. 3 depicts a circuit diagram for one exemplary programmable capacitor, which may be used as the transmitter capacitor 130. In this embodiment, transmitter capacitor 130 comprises multiple positive capacitor/switch pairs 132 associated with the positive output connected in parallel between the a first end B1 of the balun 122 and a ground $V_{ss\_sw}$, and multiple negative capacitor/switch pairs 134 associated with the negative output connected between the a second end B2 of the balun 122 and the ground $V_{ss\_sw}$. Each capacitor/switch pair 132, 134 comprises a capacitor 136, which may comprise a fixed capacitor, and a switch 138, e.g., an NMOS switch. Control signals $C_{tx,n}$, one for each of the n positive/negative pairs of capacitor/switch pairs, control the switches 138 to selectively connect or disconnect the corresponding capacitor 136 to or from $V_{ss\_sw}$. By selectively activating the switches 138, and/or tuning the capacitors 136 in the case of tunable capacitors, controller 160 selectively controls the capacitance of the transmitter capacitor 130. For example, if each of the individual capacitors 136 has a capacitance of 200 fF, and if $C_{tx0}$ and $C_{tx2}$ is enabled while $C_{tx1}$ is disabled, transmitter capacitor 130 will have a capacitance of 400 fF. While FIG. 3 shows equivalent capacitor/switch pairs, it will be appreciated that such is not required. In some embodiments the capacitor/switch pairs 132, 134 comprise scaled versions, where the first pair 132, 134 controlled by $C_{tx0}$ is as drawn, the second pair controlled by $C_{tx1}$ uses twice as many pairs 132, 134 while sharing the inputs, outputs, and $V_{ss\_sw}$, and the third pair controlled by $C_{tx2}$ uses four times as many pairs while sharing the inputs, outputs, and $V_{ss\_sw}$.

While the programmable capacitor of FIG. 3 is described as corresponding to the transmitter capacitor 130, the antenna capacitor 140 may have a similar configuration. In the case of an antenna capacitor 140, the B1 and B2 connections depicted in FIG. 3 would instead be the B3 and B4 connections, respectively, of the second inductive winding 126, and the control signals would be $C_{ant,n}$.

While not explicitly shown, a buffer and/or a series resistor may be included at the gate of the switches 138 to facilitate RF isolation. Further, in FIG. 3, $V_{ss\_sw}$ represents a virtual ground. In some embodiments, $V_{ss\_sw}$ may be connected to $V_{ss}$. The $V_{ss\_sw}$ node is a virtual ground for perfectly balanced signals at B1 and B2. However, even harmonics are in phase, causing unwanted harmonic currents to show up on node $V_{ss\_sw}$. A series resistor may be included at the gate $V_{ss}$ of the switches to prevent this. In addition, a decoupling capacitor (not shown) may be added between $V_{ss\_sw}$ and $V_{dd}$ to guide the harmonic currents back to the supply. As such RF design details are understood by those skilled in the art and are not critical to the details of the invention disclosed herein, they are not discussed further herein.

Figure 4:
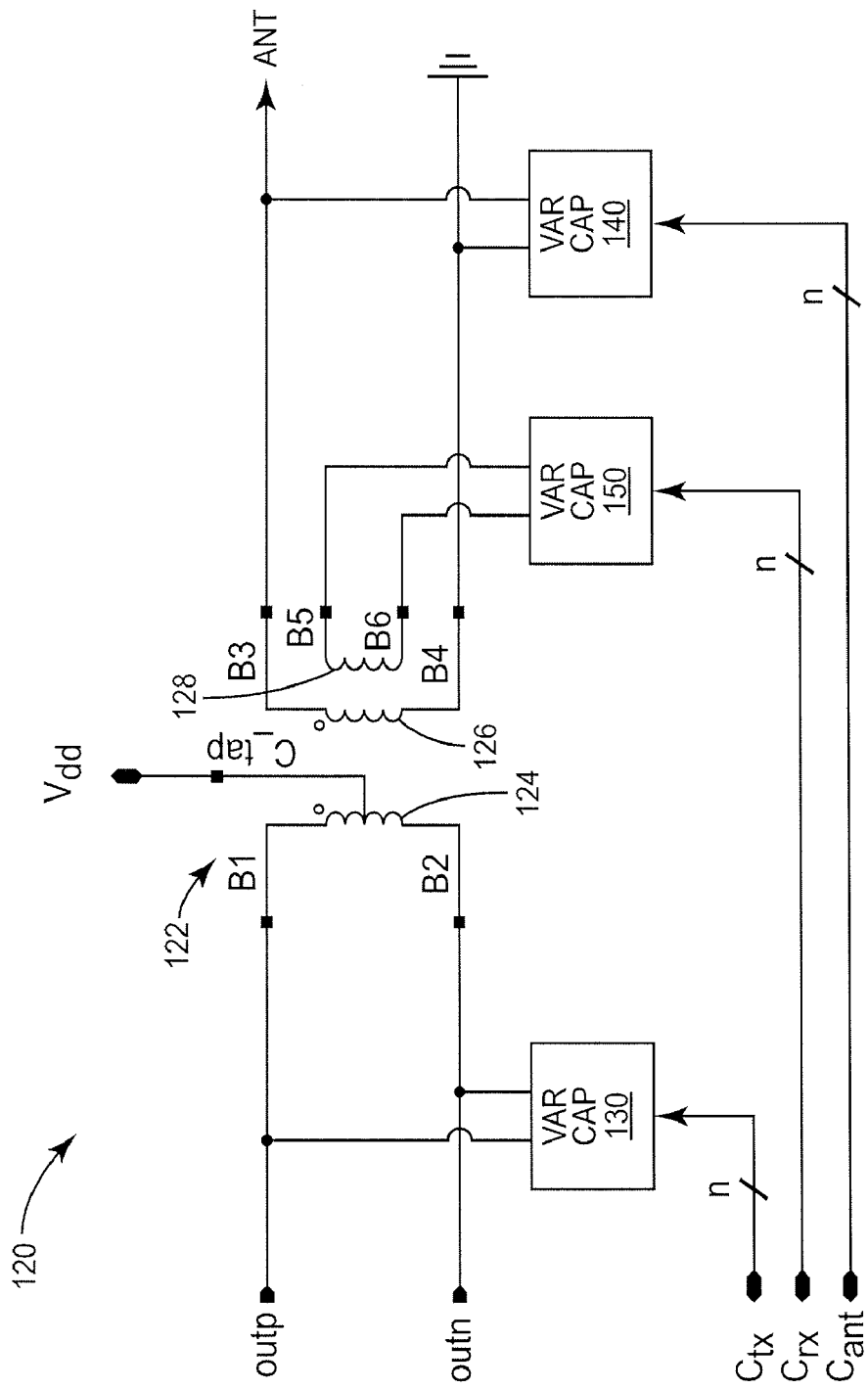
FIG. 4 depicts a circuit diagram of another exemplary adaptive impedance unit for the on-chip power amplifier disclosed herein.

The adaptive impedance unit 120 is not limited to the double-winding balun of FIG. 2. For example, FIG. 4 depicts another embodiment, where the adaptive impedance unit 120 comprises a triple-winding balun 122. The first and second windings 124, 126 connect to the differential amplifier 110 and variable capacitors 130, 140 as discussed with respect to FIG. 2. The third winding 128 comprises a receiver winding 128 having connection points B5 and B6. A receiver variable capacitor 150, which may comprise the same capacitor configuration as either of the transmitter and antenna capacitors, is connected to connection points B5, B6 in parallel with the third winding 128 to connect both the receiver and the transmitter to the same antenna. Like the antenna variable capacitor 140, varying the receiver variable capacitor 150 varies the real part of the load impedance with little to no impact on the imaginary part. It will be appreciated that the transmitter, antenna, and receiver capacitors 130, 140, 150 do not have to have the same configuration, capacitance range, or capacitance. In one exemplary embodiment, the lowest feasible capacitance is chosen for receiver variable capacitor 150 to minimize the impact of the receiver variable capacitor 150 on the amplifier load impedance. During receive modes, the same capacitance control applied to variable capacitors 130, 140 may be used.

FIGS. 5A-5D depict simulated performance results for embodiments of the power amplifier circuit described herein. In each of FIGS. 5A and 5B, the different curves correspond to different capacitance values for the transmitter capacitor 130, and the different data points on each curve correspond to different capacitance values for the antenna capacitor 140. In particular, FIGS. 5A and 5B respectively plot the imaginary and real parts of the load impedance vs. antenna capacitance for eight different transmitter capacitances ranging between 1.474 pF (curve 0 marked by diamonds) and 0.417 pF (curve 7 marked by rectangles), where the antenna capacitance ranges between 1.21 pF (data point 0) and 0.69 pF (data point 7). Further, in each of FIGS. 5C and 5D, the different curves correspond to different capacitance values for the antenna capacitor 140, and the different data points on each curve correspond to different capacitance values for the transmitter capacitor 130. In particular, FIGS. 5C and 5D respectively plot the imaginary and real parts of the load impedance vs. antenna capacitance for eight different transmitter capacitances ranging between 1.21 pF (curve 0 marked by diamonds) and 0.69 pF (curve 7 marked by rectangles), where the transmitter capacitance ranges between 1.474 pF (data point 0) and 0.417 pF (data point 7).

Figure 5A:
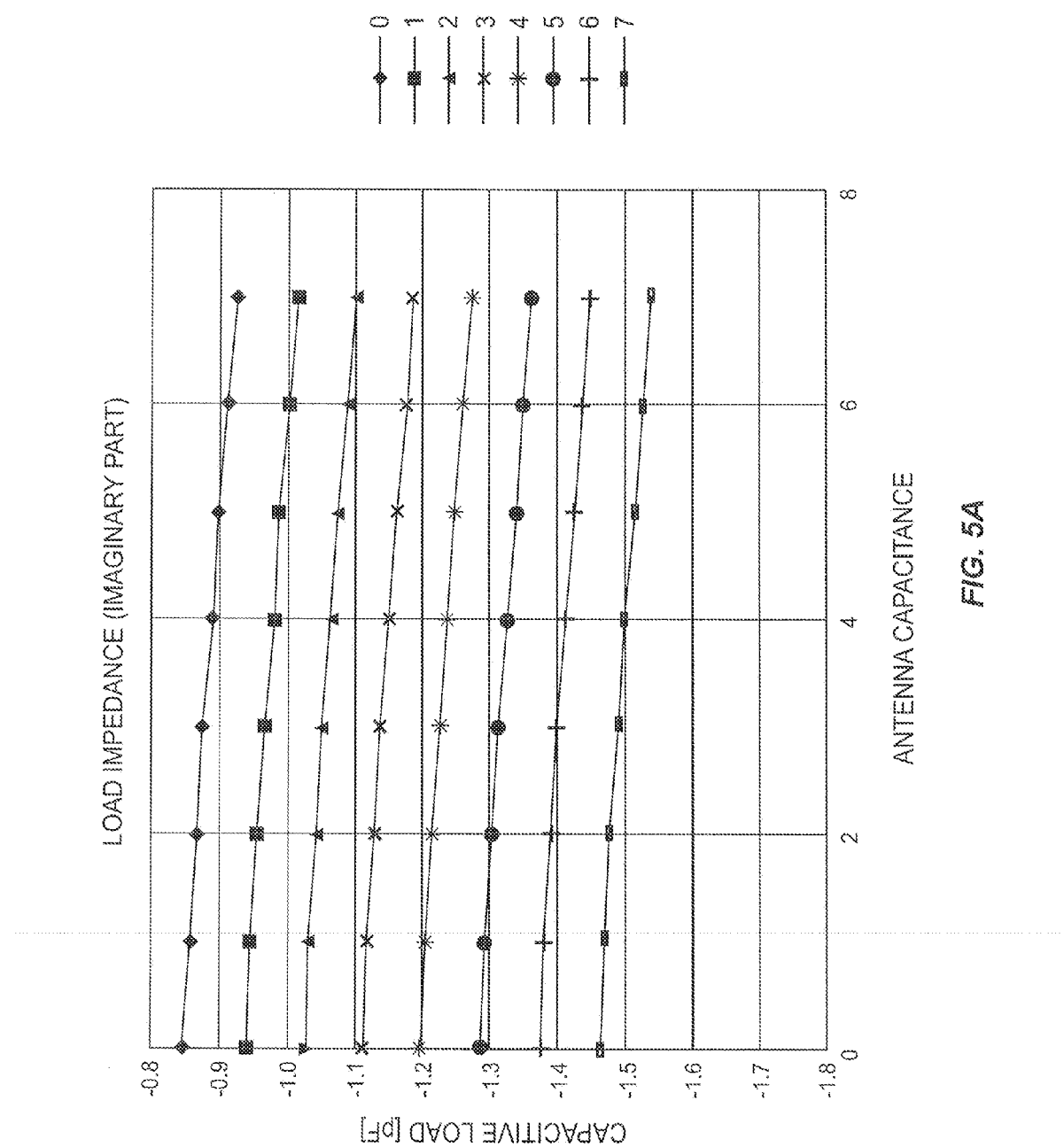
FIGS. 5A-5D depict simulated performance results for the on-chip power amplifier disclosed herein.

As depicted by the nearly horizontal curves in FIG. 5A, varying the capacitance of the antenna capacitor 140 impacts the imaginary part of the amplifier load impedance by less than 10% over the 0.5 pF range of antenna capacitances. Similarly, as depicted by the nearly horizontal curves in FIG. 5D, varying the capacitance of the transmitter capacitor 130 impacts the real part of the amplifier load impedance by less than 15% over the 1 pF range of transmitter capacitances. This demonstrates that the capacitors 130, 140 are largely orthogonal. That is, varying the capacitance of the antenna capacitor 140 has very little impact on the imaginary part of the amplifier load impedance, and varying the capacitance of the transmitter capacitor 130 has very little impact on the real part of the amplifier load impedance.

Figure 5B:
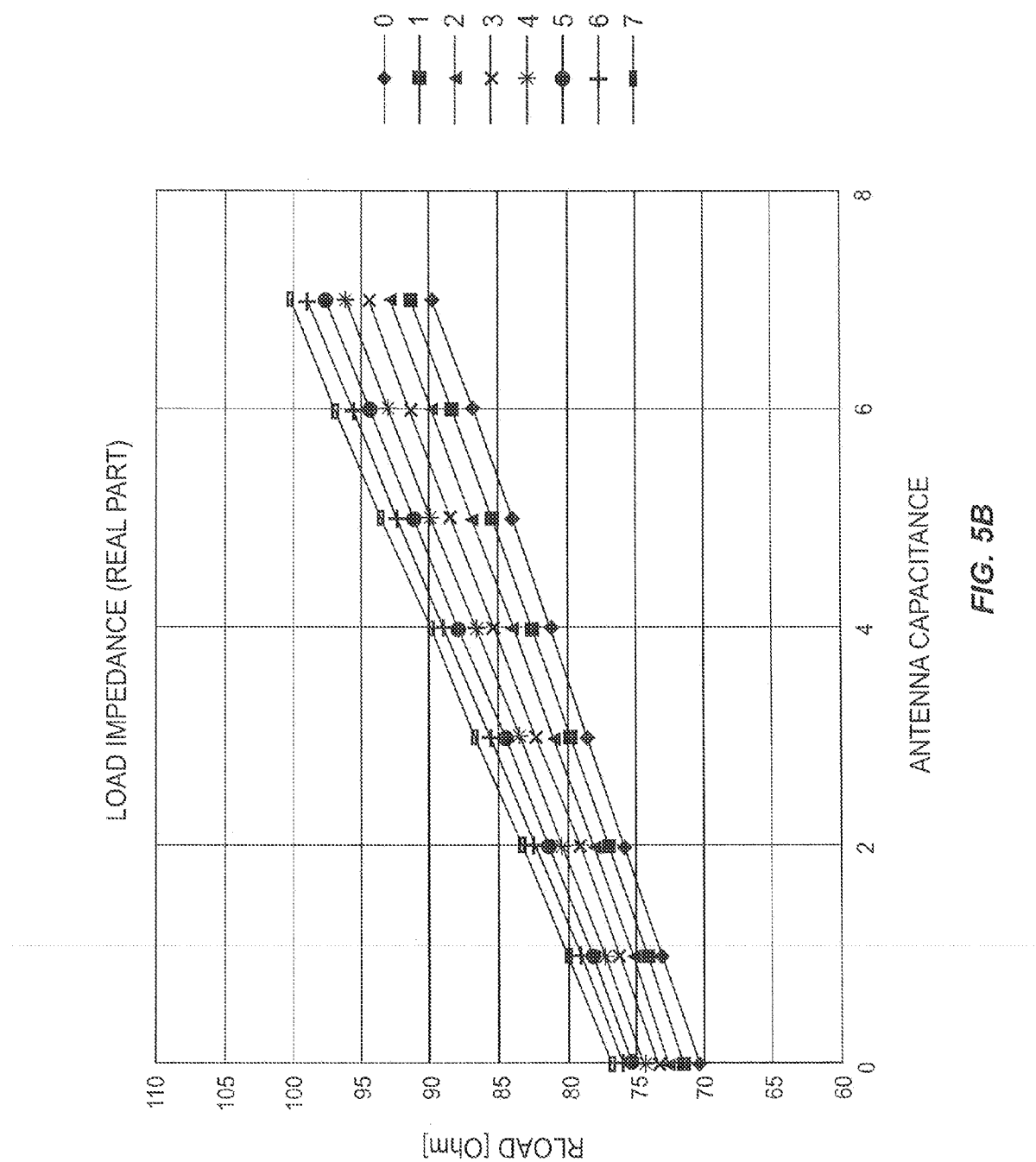
Figure 5C:
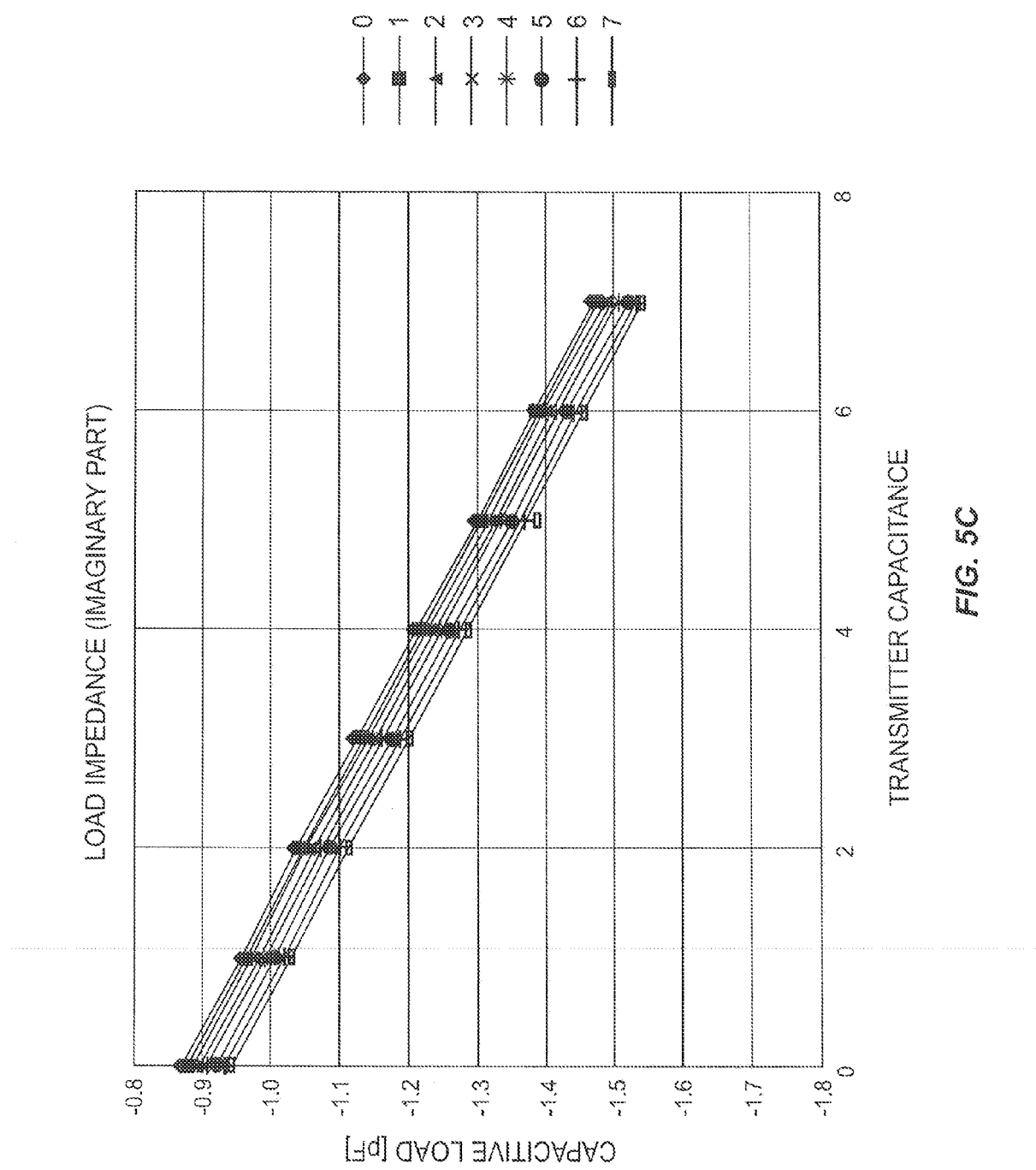
Figure 5D:
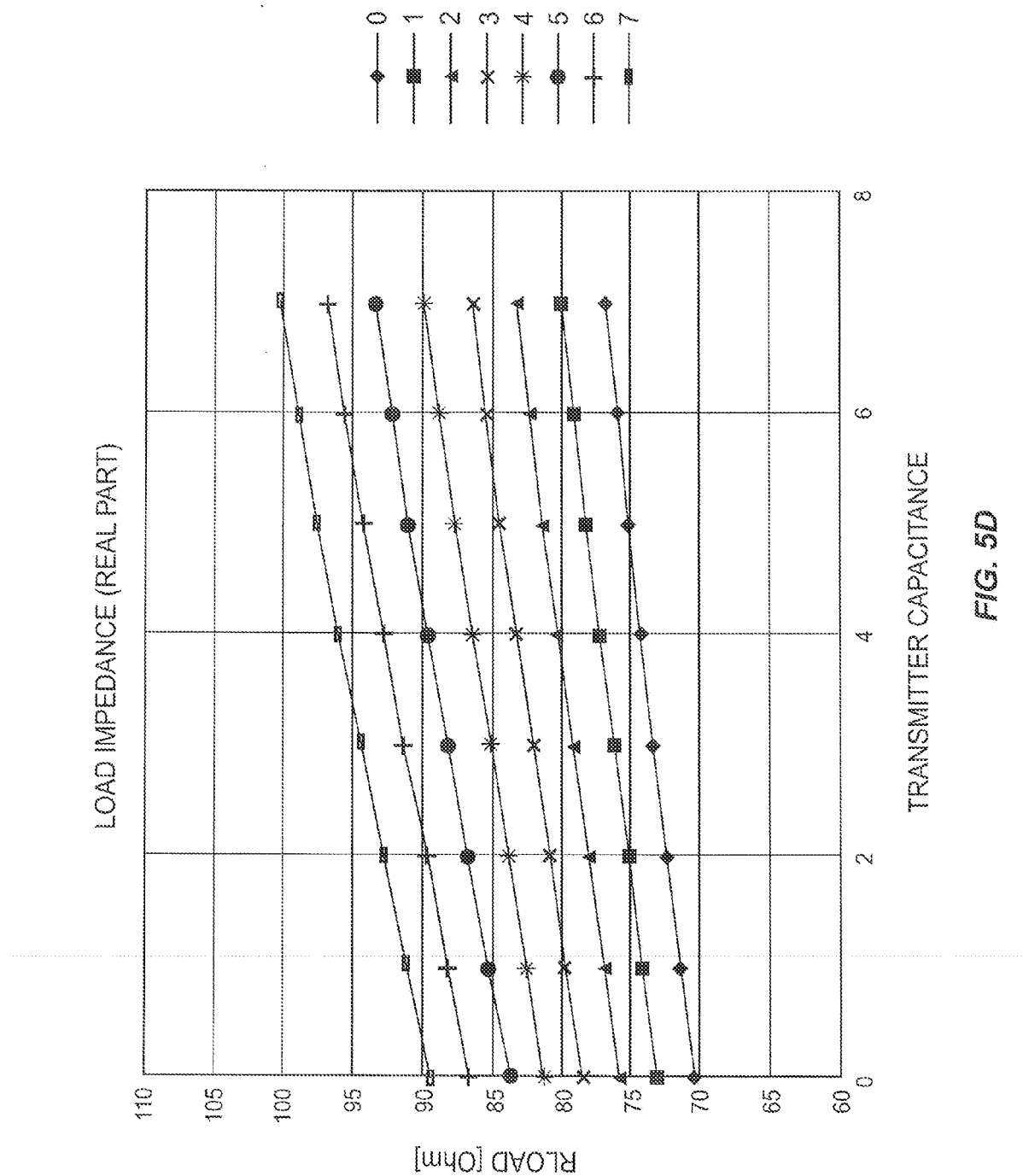

FIGS. 5B and 5C demonstrate this same point in a slightly different manner. Because the different curves in FIG. 5B are very closely packed together, FIG. 5B depicts that different transmitter capacitances (associated with the different curves) produce nearly identical results for the real part of the amplifier load impedance. Similarly, because the different curves in FIG. 5C are very closely packed together, FIG. 5C depicts that different antenna capacitances (associated with the different curves) produce nearly identical results for the imaginary part of the amplifier load impedance.

Figure 6B:
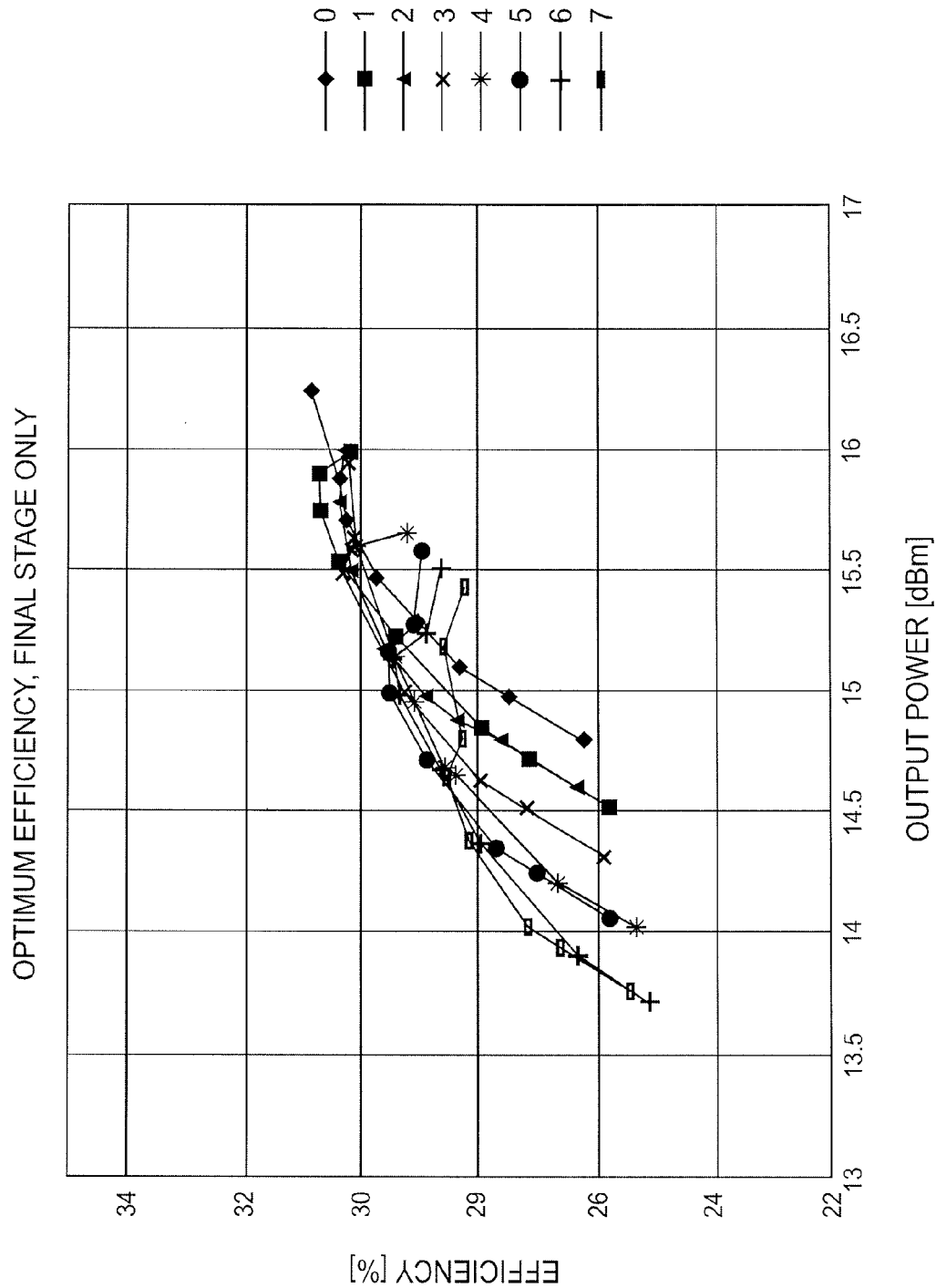

FIGS. 6A-6D depict additional simulated performance results for the power amplifier circuit described herein. In FIGS. 6A-6D each curve corresponds to a different transmitter capacitance value (ranging between 0.417 pF for curve 7 marked by rectangles and 1.474 pF for curve 0 marked by diamonds), and each data point along each curve corresponds to a different antenna capacitance value (ranging between 0.69 for data point 7 pF and 1.21 pF for data point 0). FIG. 6A depicts that for each of the 64 different combinations of antenna and transmitter capacitance values, the current consumption changes dramatically (between 52 mA and 76 mA) over a relatively small output power window (between 13.75 dBm and 16.25 dBm). Because current consumption is so closely linked to amplifier efficiency, FIG. 6A depicts that the transmitter and antenna capacitors 130, 140 may be varied to achieve a desired efficiency with little to no impact on the amplifier output power. This point is further demonstrated in FIG. 6B, which plots amplifier efficiency vs. output power for all 64 different combinations of antenna and transmitter capacitance values. As depicted in FIG. 6B, varying the transmitter and antenna capacitors 130, 140 causes the amplifier efficiency to vary by 6% (e.g., between 25% and 31%), while changing the output power variations to about 2.5 dB (e.g., between 13.75 dBm and 16.25 dBm).

Figure 6C:
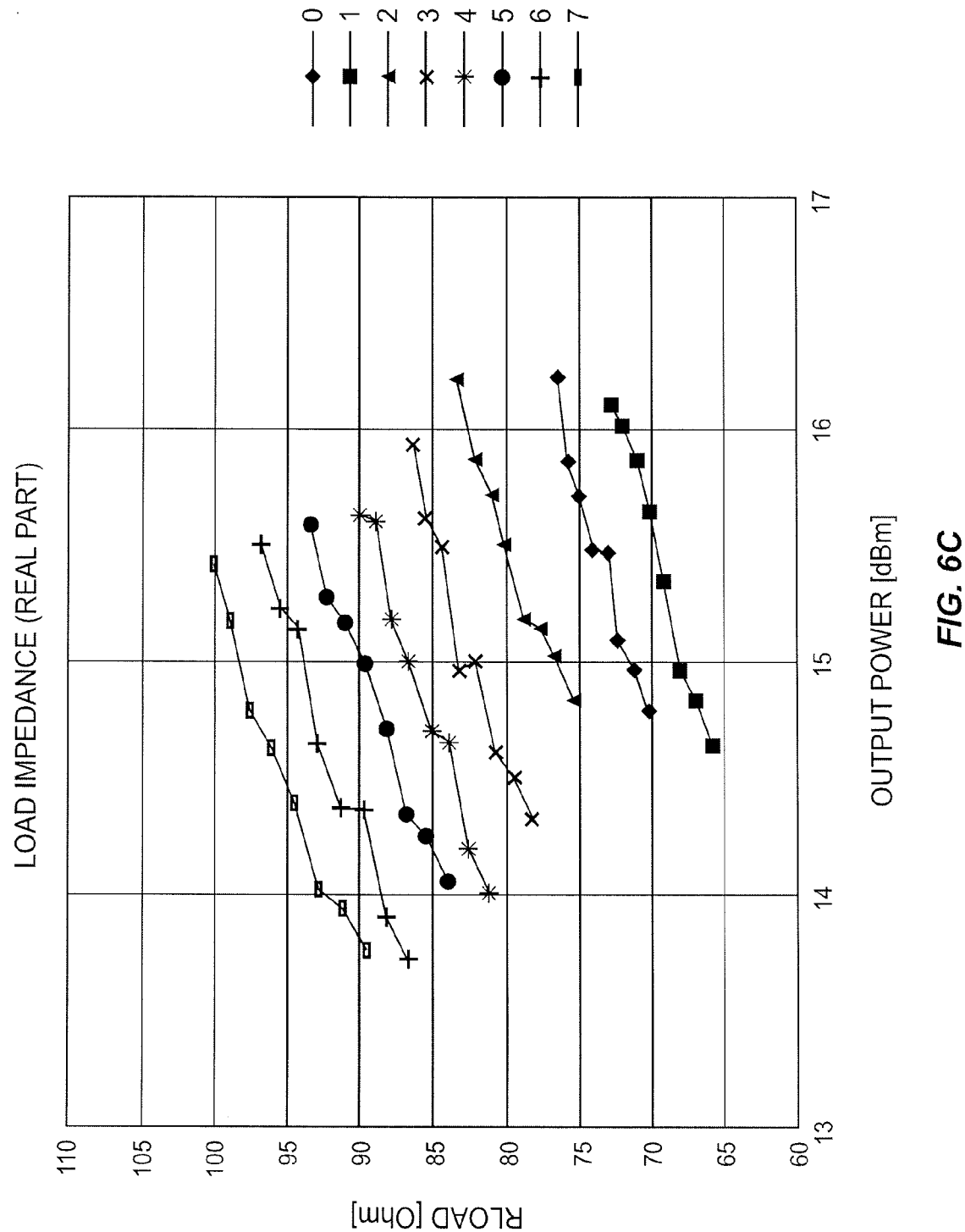
Figure 6D:
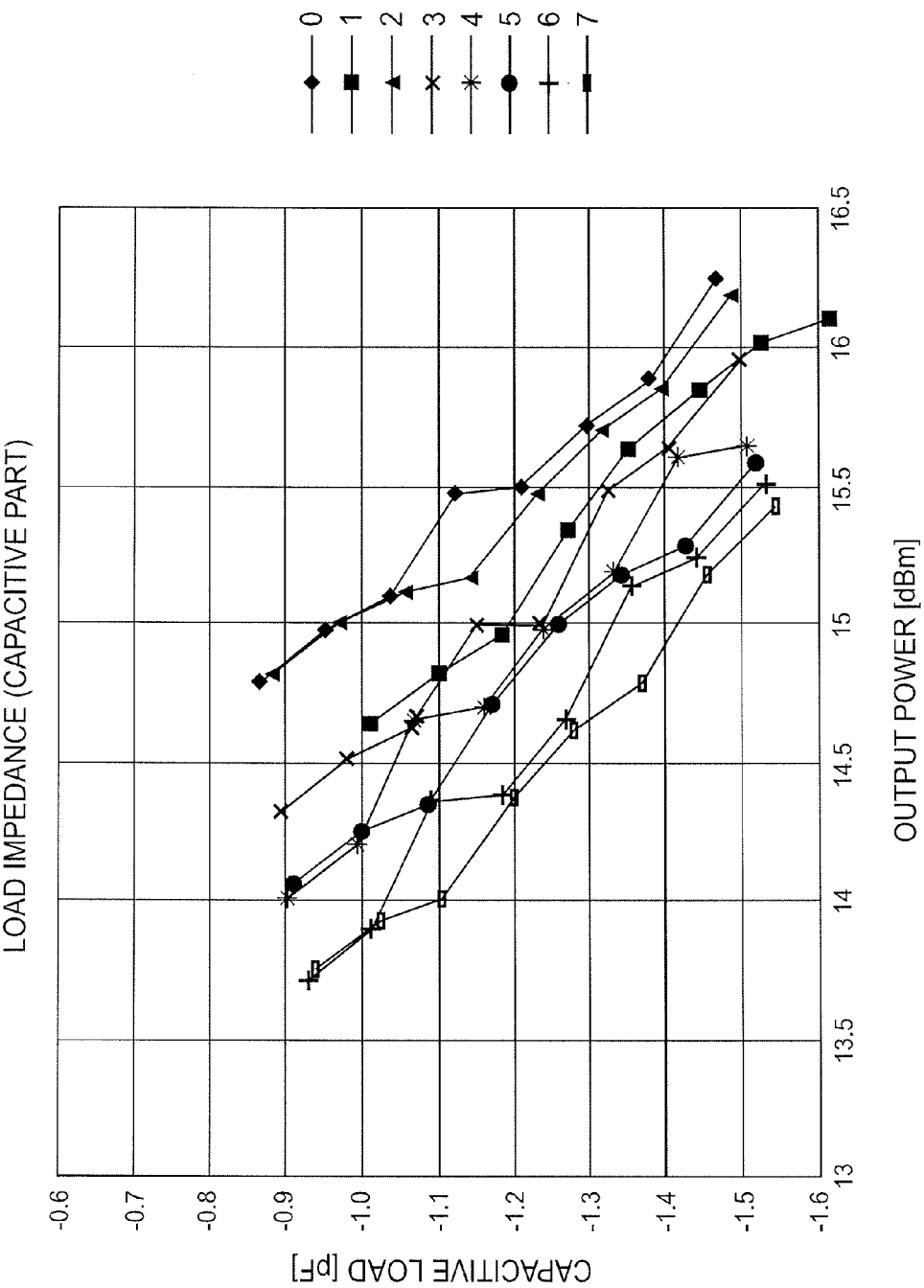

FIG. 6C plots the real part of the load impedance ($R_{load}$) vs. output power, while FIG. 6D plots the imaginary part of the load impedance ($C_{load}$) vs. output power. FIG. 6C depicts that while the output power increases with increasing $R_{load}$, the smaller $R_{load}$ values result in larger output powers. FIG. 6D depicts that the output power increases with decreasing $C_{load}$, and that the larger $C_{load}$ values result in larger output powers.

Controlling the load impedance of an on-chip power amplifier as described herein has several advantages. First, the impedance control described herein enables different efficiencies and/or different power levels to be achieved with the same power amplifier chip. For example, a +13 dBm (low load) impedance and a +10 dBm (high load) impedance with the best efficiency can be achieved with the same power amplifier chip. Further, because the variable capacitors may be digitally controlled, the amplifier load impedance may be changed using software. Such digital control also enables customer-specific defaults to be generated to provide the best amplifier load impedance for a particular customer application. In addition, impedance mismatch between the power amplifier and the antenna may be corrected without desoldering the chip. In some cases, e.g., when the transmitter and antenna capacitors 130, 140 are digitally controlled, the impedance mismatch may be corrected remotely by connecting a given circuit to a remote computer system.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. An on-chip power amplifier comprising:
   a differential amplifier having differential outputs;
   a balun having a first winding operatively connected between the differential outputs;
   a first variable capacitor operatively connected to the differential outputs in parallel with the first winding of the balun, said first variable capacitor configured to control an imaginary part of a load impedance of the differential amplifier; and
   a second variable capacitor operatively connected in parallel with a second winding of the balun, said second variable capacitor configured to control a real part of the load impedance of the differential amplifier.

2. The power amplifier of claim 1 wherein the first and second variable capacitors comprise digitally tunable capacitors.

3. The power amplifier of claim 1 wherein the first and second variable capacitors are generally orthogonal.

4. The power amplifier of claim 3 wherein the first and second capacitors are less than 25% correlated.

5. The power amplifier of claim 1 wherein control of the first variable capacitor further impacts the real part of the load impedance differently than the imaginary part, and wherein control of the second variable capacitor further impacts the imaginary part of the load impedance differently than the real part.

6. The power amplifier of claim 1 wherein the balun comprises a third winding operatively connected to a receiver.

7. The power amplifier of claim 6 further comprising a third variable capacitor operatively connected in parallel with the third winding of the balun.

8. The power amplifier of claim 7 wherein the first, second, and third variable capacitors comprise digitally tunable capacitors.

9. The power amplifier of claim 7 wherein the second variable capacitor is further operatively connected to an antenna.

10. A method of controlling a load impedance of an on-chip power amplifier comprising a balun having a first winding operatively connected between differential outputs of a differential amplifier, the method comprising:

varying a first variable capacitor operatively connected to the differential outputs in parallel with a first winding of the balun to vary an imaginary part of the load impedance of the power amplifier; and varying a second variable capacitor operatively connected in parallel with a second winding of the balun to vary a real part of the load impedance of the differential amplifier.

11. The method of claim 10 wherein the first and second variable capacitors comprise digitally tunable capacitors, and wherein varying the first and second variable capacitors comprises digitally controlling the first and second variable capacitors.

12. The method of claim 10 wherein the first and second capacitors are generally orthogonal.

13. The method of claim 10 wherein the first and second capacitors are less than 25% correlated.

14. The method of claim 10 wherein varying the first variable capacitor further impacts the real part of the load impedance differently than the imaginary part, and wherein varying the second variable capacitor further impacts the imaginary part of the load impedance differently than the real part.

15. The method of claim 10 further comprising varying a third variable capacitor operatively connected in parallel with a third winding of the balun, said third variable capacitor further operatively connected to a receiver.

16. The method of claim 15 wherein the first, second, and third variable capacitors comprise digitally tunable capacitors.

17. The method of claim 15 wherein the second variable capacitor is further operatively connected to an antenna.

* * * * *